United States Patent [19]

Ryou

[11] Patent Number: 5,516,719

[45] Date of Patent: May 14, 1996

[54] METHOD FOR THE FABRICATION OF A CAPACITOR IN A SEMICONDUCTOR DEVICE

[75] Inventor: Eui K. Ryou, Bubaleub, Rep. of Korea

[73] Assignee: Hyundai Electronics Industries Co., Ltd., Kyoungkido, Rep. of Korea

[21] Appl. No.: 247,864

[22] Filed: May 23, 1994

[30] Foreign Application Priority Data

May 21, 1993 [KR] Rep. of Korea ............... 1993-8839

[51] Int. Cl.$^6$ .................... H01L 21/70; H01L 27/00
[52] U.S. Cl. ...................... 437/60; 437/47; 437/49; 437/52; 437/919; 148/DIG. 14
[58] Field of Search ................. 437/47, 48, 52, 437/60, 919, 229, 49; 149/DIG. 14

[56] References Cited

U.S. PATENT DOCUMENTS

| | | | |
|---|---|---|---|
| 5,023,203 | 6/1991 | Choi | 437/229 |
| 5,061,650 | 10/1991 | Dennison et al. | 437/47 |
| 5,158,905 | 10/1992 | Ahn | 437/52 |
| 5,192,702 | 3/1993 | Tseng | 437/47 |
| 5,227,322 | 7/1993 | Ko et al. | 437/52 |
| 5,231,044 | 7/1993 | Jun | 437/47 |
| 5,278,091 | 1/1994 | Fazan et al. | 437/60 |
| 5,296,410 | 3/1994 | Yang | 437/229 |
| 5,330,614 | 7/1994 | Ahn | 437/60 |

*Primary Examiner*—Tuan H. Nguyen
*Attorney, Agent, or Firm*—Merchant, Gould, Smith, Edell, Welter & Schmidt

[57] ABSTRACT

There is disclosed a method for the fabrication of capacitor, comprising the steps of: coating an insulating film over a transistor and applying planarization to the insulating film; etching the insulating film, to form a contact hole exposing an active region of the transistor therethrough and forming a conductive polysilicon film over the insulating film, so as to bring the conductive polysilicon film into contact with the active region; forming a plurality of first spacer oxide films and a plurality of second spacer oxide films on the polysilicon film, in due order; carrying out etch, so as to attenuate the conductive polysilicon films; etching the conductive polysilicon film by use of the plurality of spacer oxide films as an etch mask, to form a charge storage electrode, the charge storage electrode being determined by the attenuation of the conductive polysilicon in size; and coating the surface of the charge storage electrode with a dielectric film, and forming a plate electrode on the dielectric film. There can be realized an increase in the effective area of the charge storage electrode compared to the area of the mask for the charge storage electrode. In addition, the increase in capacitance of the charge storage electrode, in turn, results in an improvement in device reliability.

9 Claims, 4 Drawing Sheets

5,516,719

METHOD FOR THE FABRICATION OF A CAPACITOR IN A SEMICONDUCTOR DEVICE

BACKGROUND OF THE INVENTION

1. Field of the Invention

The present invention relates, in general, to a method for the fabrication of a capacitor in a semiconductor device and, more particularly, to a method capable of augmenting the effective area of a charge storage electrode, thereby affording increased capacitance to the capacitor.

2. Description of the Prior Art

In relation with the integration of dynamic random access memory (hereinafter referred to as "DRAM") in a semiconductor memory device for general use, critical characteristics include the reduction of cell area and the limit in securing enough capacitance according to the reduction. For the purpose of high integration of a semiconductor integrated circuit, the reduction in unit area of the cell results in reduced capacitance. Accordingly, research and development efforts have been directed to securing not only the capacitance but also device reliability.

For a better understanding of the background of the present invention, the description of a conventional method for fabricating a capacitor in a semiconductor device along with its problems is given next, with reference to FIG. 1.

As shown in this figure, over a silicon substrate 1 a field oxide film 2 is formed and then, a field oxide film 3 is formed. The deposition of polysilicon film and the implantation of impurities form a pattern of a gate electrode 4 and a word line 4'.

Thereafter, for the sake of the improvement in electrical properties of a metal oxide semiconductor field effect transistor (hereinafter referred to as "MOSFET"), a MOSFET formation process utilizing spacer oxide films 5 is carried out to form active regions 6,6' having a structure of lightly doped drain (hereinafter referred to as "LDD").

Subsequently, an insulating oxide film 7 with a certain thickness is formed, followed by the formation of a contact hole exposing the active region therethrough. A polysilicon film 11 for charge storage electrode implanted with impurities deposited, coming into contact with the active region through the contact hole. The polysilicon film 11 is patterned on a mask, to form the charge storage electrode.

Over the charge storage electrode, there is covered a composite dielectric film 16, such as nitride-oxide hereinafter referred to as "NO") or oxide-nitride-oxide hereinafter referred to as "ONO"), which, in turn, is covered with a plate electrode 17 which is formed by patterning a polysilicon film implanted with impurities in a predetermined size.

In the light of the capability of present processing, however, the conventional method has difficulty in securing enough charge storage capacitance in a cell as the device is highly integrated. In addition, device reliability becomes deteriorated with the indicated difficulties.

SUMMARY OF THE INVENTION

Therefore, an object of the present invention is to overcome the above problems encountered in the prior art and to provide a method for the fabrication of capacitor, capable of increasing the effective area of a charge storage electrode sufficient to achieve a high degree of integration in a semiconductor device.

In accordance with the present invention, the above object can be accomplished by providing a method for the fabrication of a capacitor in a semiconductor device, comprising the steps of: coating an insulating film over a transistor and applying planarization to the insulating film; etching the insulating film, to form a contact hole exposing an active region of the transistor therethrough and forming a conductive polysilicon film over the insulating film, so as to bring the conductive polysilicon film into contact with the active region; forming a plurality of first spacer oxide films and a plurality of second spacer oxide films on the polysilicon film, in due order; carrying out etch, so as to attenuate the conductive polysilicon films; etching the conductive polysilicon film by use of the plurality of spacer oxide films as an etch mask to form a charge storage electrode, the charge storage electrode being determined by the attenuation of the conductive polysilicon in size; and coating the surface of the charge storage electrode with a dielectric film, and forming a plate electrode on the dielectric film.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE INVENTION

Figure 1:
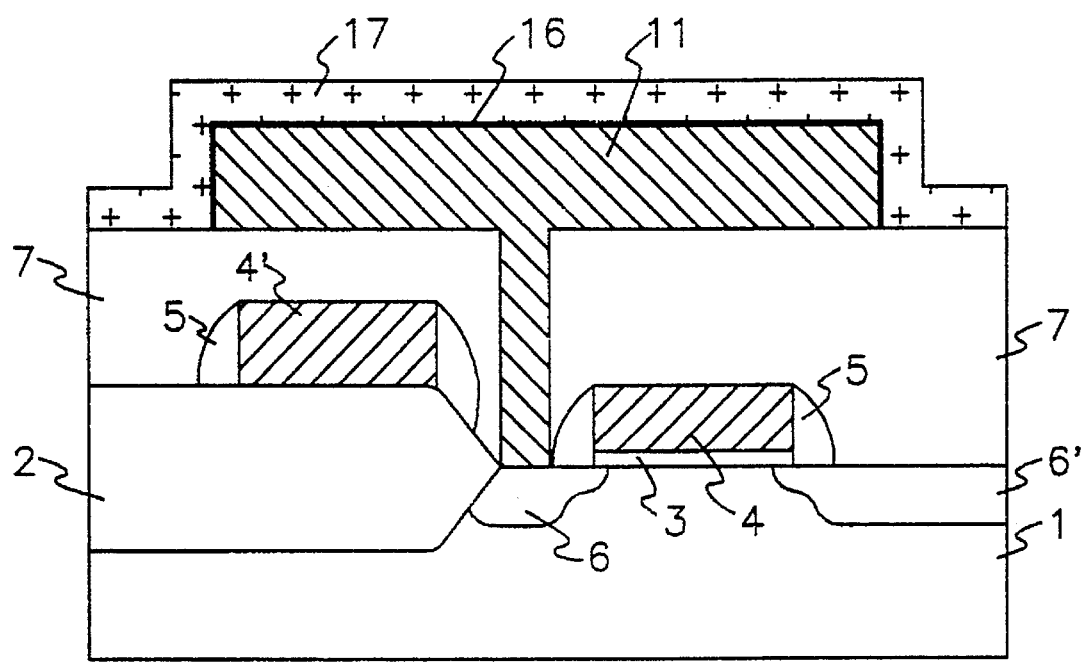
FIG. 1 is a schematic, cross sectional view illustrating a conventional method for the fabrication of a capacitor.

Hereinafter, the preferred embodiment of the present invention will be described with reference to the accompanying drawings, wherein like reference numerals designate like parts, respectively.

Referring initially to FIGS. 2A through 2D, there is illustrated a method for the fabrication of a capacitor according to the present invention.

Figure 2A:
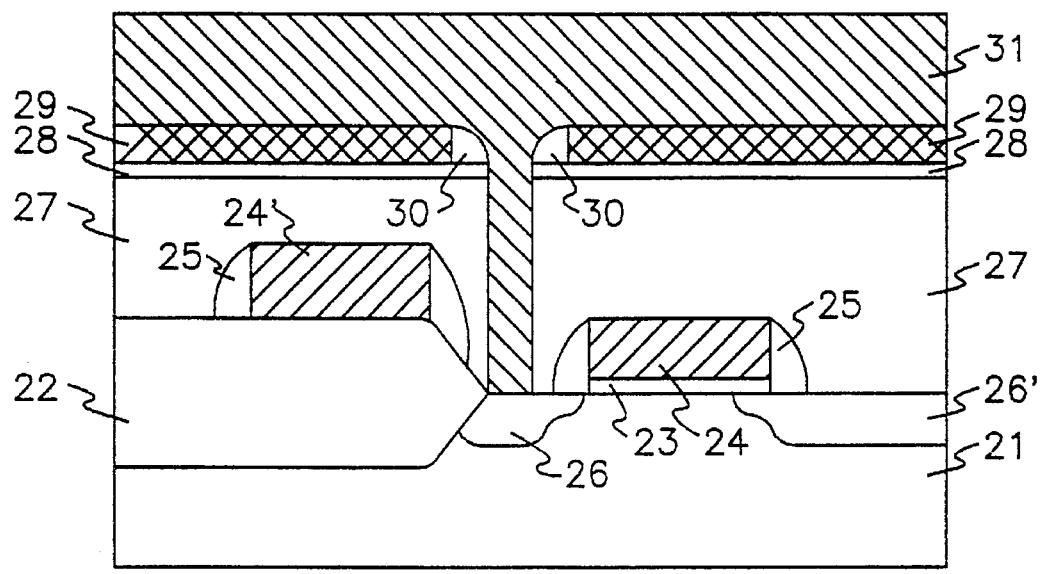
FIGS. 2A through 2D are schematic, cross sectional views illustrating a method for the fabrication of a capacitor, according to the present invention.

First, as illustrated in FIG. 2A, on a silicon substrate 21 having a P-well, a field oxide film 22 is formed by performing so-called LOCOS (local oxidation of silicon) process, and a gate oxide film 23 is deposited, followed by the deposition of a first polysilicon film for both gate electrode and word line without time delay.

This figure also shows a gate electrode 24 and a word line 24' both of which are formed by implanting impurities into the first polysilicon film and etching this polysilicon film by use of a mask. Relatively low density N-type impurities are implanted into the silicon substrate and then, a spacer oxide film 25 is formed at each of the side walls of the gate electrode 24, followed by the implantation of relatively high density N-type impurities into the silicon substrate 21. As a result of these implantations, an MOSFET having an LDD structure of active regions 26,26' comes to be formed.

It is further illustrated in FIG. 2A that over the resulting structure including the MOSFET, there is entirely formed a thick insulating oxide film 27, which is subsequently subjected into blanket etching, to plane the surface thereof. On the planed insulating film 27, a silicon nitride film 28 serving as an etch stopper is formed in a certain thickness, on which a second polysilicon film 29 is deposited entirely.

Thereafter, using a contact hole mask, the second polysilicon film 29 is selectively etched. A third polysilicon film is deposited and subjected to anisotropic etching, to form a spacer polysilicon film 30. Using the second polysilicon film 29 and the spacer polysilicon film 30 as an etch barrier, selective etch is applied to the silicon nitride film 28 and the insulating oxide film 27, in succession, so as to form a contact, hole on the active region 26 of the MOSFET.

A fourth polysilicon film 31 for charge storage electrode which has a layer of impurities therein is deposited so as to come into contact with the active region. At this point, the charge storage electrode is preferably spread more extensively than the word line 24' and the gate electrode 24.

Figure 2B:
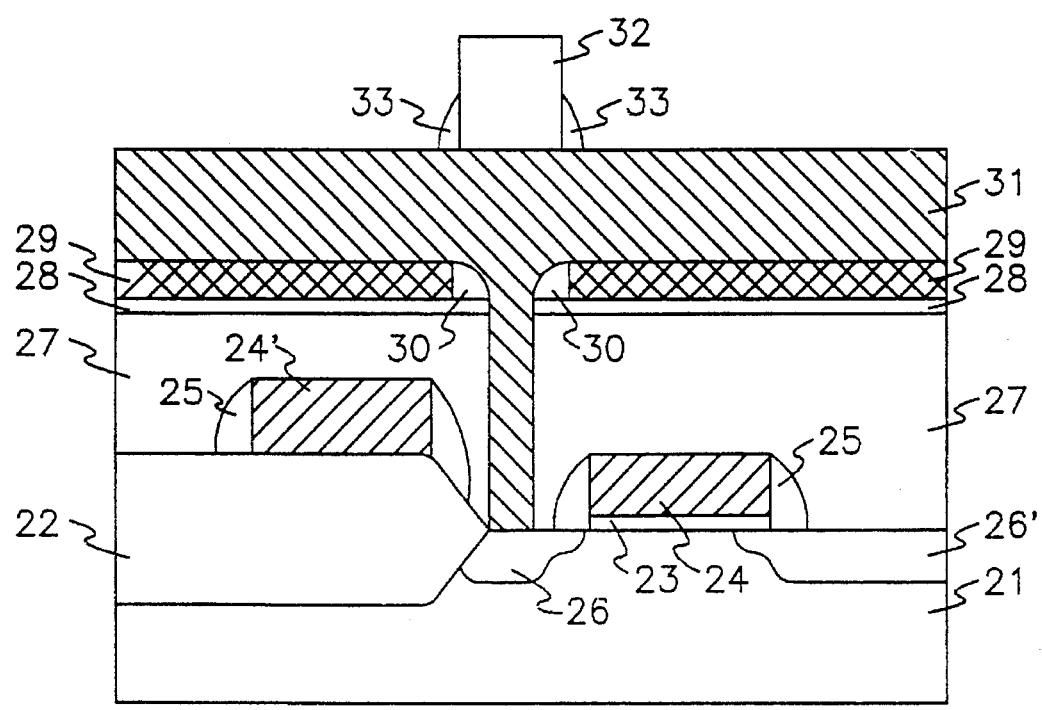

Next, as illustrated in FIG. 2B, on the charge storage electrode 31, there is developed a photosensitive film pattern 32 by use of a contact hole mask, and a sacrificial oxide film covering the photosensitive film pattern 32 is formed, which is then subjected to anisotropic etch, to form a spacer sacrificial oxide film 33 at each of the side walls of the photosensitive film pattern 32. When forming the spacer sacrificial oxide film 33, a contact hole mask and a negative photoresist or a similar mask are utilized.

Figure 2C:
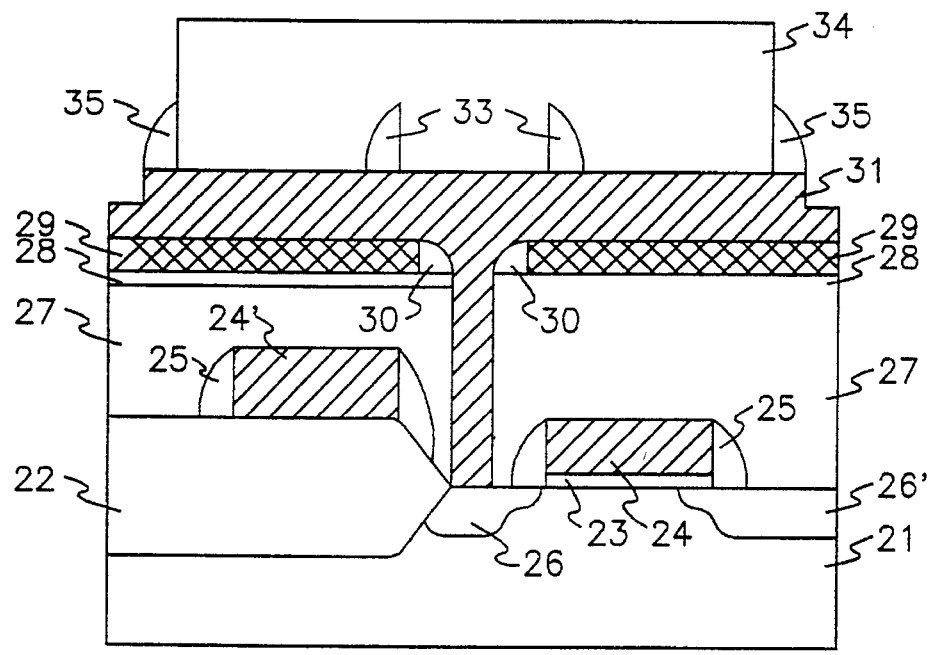

Subsequently, as illustrated in FIG. 2C, the photosensitive film pattern 32 is removed, and another photosensitive film pattern 34 covering the spacer sacrificial oxide film 33 is developed, which then, is covered with another thick sacrificial oxide film.

In this figure, it is illustrated that, from the sacrificial oxide film, another pair of spacer sacrificial oxide films 35 are formed at both the side walls of the photosensitive film pattern 34 by applying anisotropic etch thereto.

FIG. 2C also illustrates that, using the photosensitive film pattern 34 and the spacer sacrificial oxide films 35 as an etch barrier, the polysilicon film 31 for charge storage electrode is subjected to etch, so that it is attenuated in exposed portions.

Figure 2D:
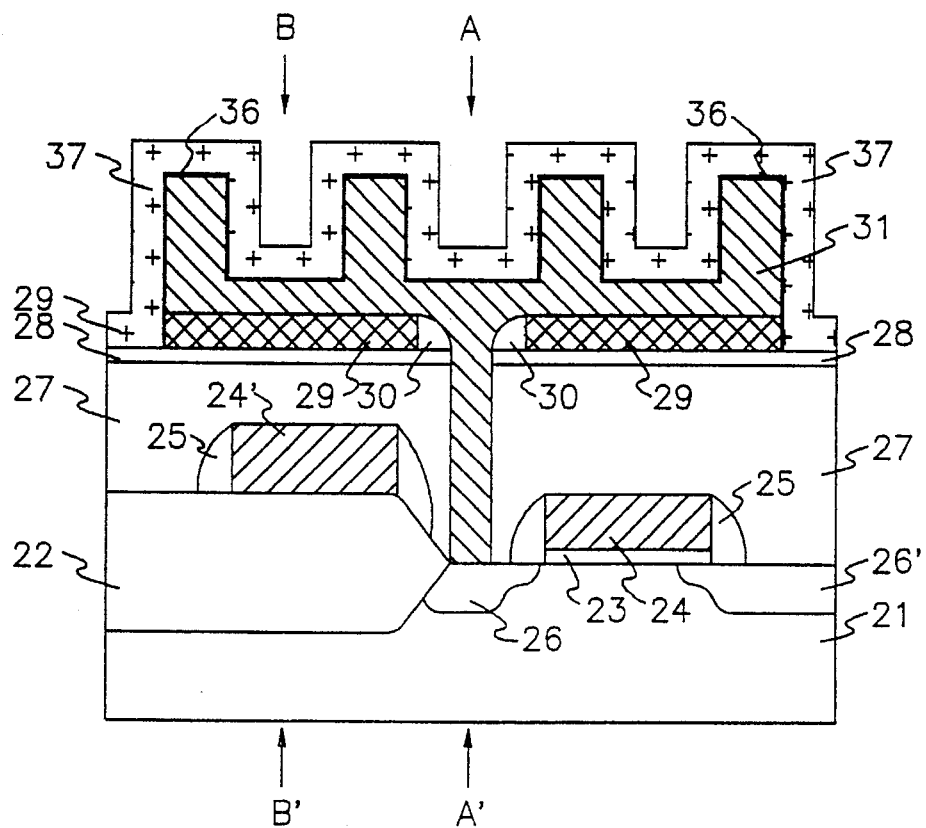

Finally, as illustrated in FIG. 2D, the photosensitive film pattern 34 is removed, and then, using the sacrificial oxide films 33, and 35 as an etch barrier, the polysilicon film 31 for charge storage electrode is subjected to etch, until the silicon nitride film 28 below the attenuated portions thereof is exposed whereas the silicon nitride film 28 below the thick the polysilicon film 31 protected by both of the photosensitive film pattern 34 and the spacer sacrificial oxide films 35 is not exposed.

FIG. 2D further shows that wet etch is applied to remove the spacer sacrificial oxide films 33 and 35, and along the exposed surface of the resulting fourth polysilicon film 31 and second polysilicon film 29, there is formed a composite dielectric film 36, such as NO or ONO.

Covering the composite dielectric film 36, a fifth polysilicon film implanted with impurities is deposited, which is then patterned, so as to form a plate electrode 37, as also illustrated in FIG. 2D.

Alternatively, a charge storage electrode may be formed by etching the polysilicon film 31 in the absence of the silicon nitride film 28. In this case, all of the polysilicon film 31 but the portions covered with the spacer sacrificial oxide films 33 and 35 may suffer from removal, and the insulating film 27 may be removed in part, as well. In this regard, the silicon nitride film 28 may be substituted by another insulating film which is utilized to etch the polysilicon film 31 with the difference of etch selection ratio between the insulating films present.

Thermal processing for the growth of dielectric film 36, such as annealing, diffuses the impurities into both the polysilicon film 29 and the spacer polysilicon 30, so that they can serve as a charge storage electrode along with the polysilicon film 31 for charge storage electrode. As a result, the resulting charge storage electrode is formed into a structure in which a small cylindrical polysilicon film is surrounded by a large cylindrical polysilicon film, thereby increasing the effective area of the charge storage electrode.

Figure 3:
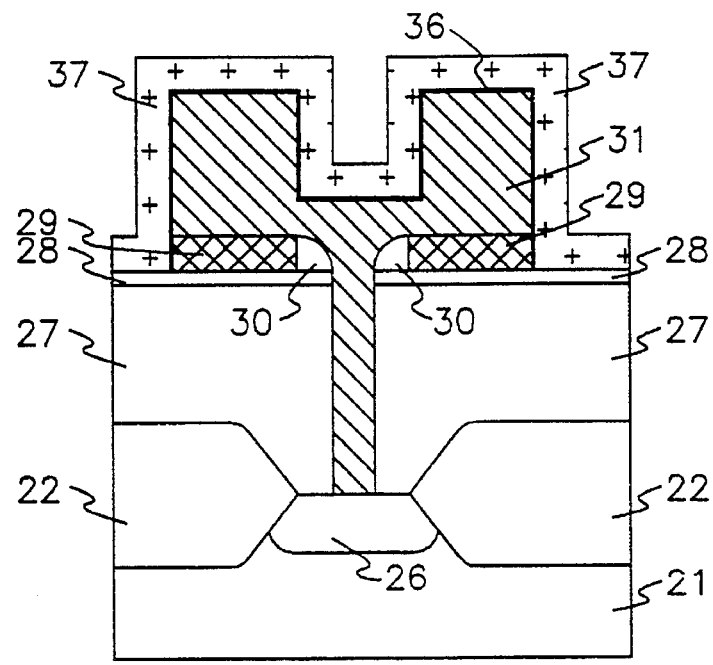
FIG. 3 is a schematic, cross sectional view illustrating the method according to the present invention, taken generally through section line A—A' of FIG. 2D for a better understanding.
Figure 4:
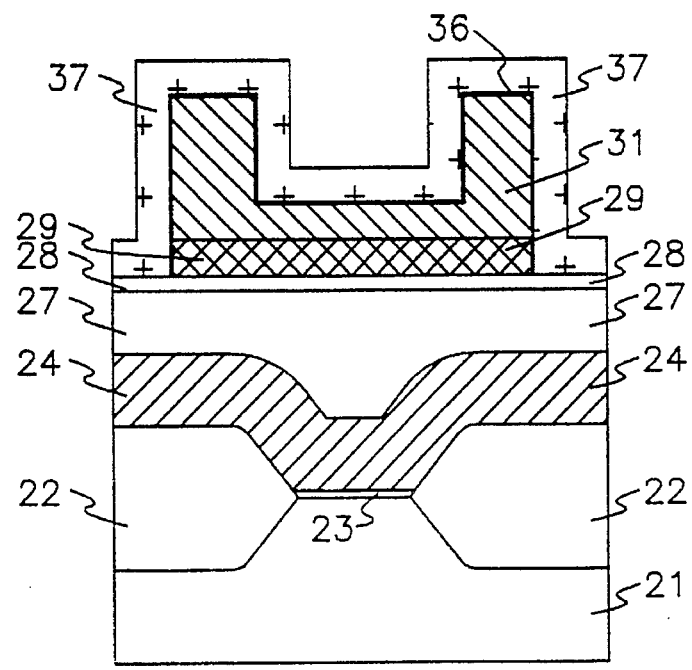
FIG. 4 is a schematic, cross sectional view illustrating the method according to the present invention, taken generally through section line B—B' of FIG. 2D for a better understanding.

FIGS. 3 and 4 which are schematic, cross sectional views taken generally through the section lines A—A' and B—B' of FIG. 2D, respectively, are suggested, in order to better understand the present invention.

As described hereinbefore, there can be brought about a greater increase in the effective area of the charge storage electrode than the area of the mask for the charge storage electrode, according to the present invention. In addition, the increase in capacitance of the charge storage electrode, in turn, results in the improvement in device reliability.

Other features, advantages and embodiments of the invention disclosed herein will be readily apparent to those exercising ordinary skill after reading the foregoing disclosure. In this regard, while specific embodiments of the invention have been described in considerable detail, variations and modifications of these embodiments can be effected without departing from the spirit and scope of the invention as described and claimed.

What is claimed is:

1. A method for fabricating a capacitor in a semiconductor device, comprising the steps of:

coating an insulating film over a transistor and applying planarization to the insulating film;

etching the insulating film to form a contact hole exposing an active region of the transistor therethrough, and forming a conductive polysilicon film over the insulating film, so as to bring the conductive polysilicon film into contact with the active region;

forming a plurality of first spacer oxide films and thereafter forming a plurality of second spacer oxide films on the conductive polysilicon film;

subjecting the conductive polysilicon film to etch, so as to attenuate it in part;

etching the conductive polysilicon film by concurrent use of the plurality of first and second spacer oxide films as an etch mask to form a charge storage electrode, said charge storage electrode being determined by the attenuation of the conductive polysilicon in size; and coating the surface of the charge storage electrode with a dielectric film, and forming a plate electrode on the dielectric film.

2. A method for fabricating a capacitor according to claim 1, wherein said step of forming a plurality of the first spacer oxide films further comprises:

developing a photosensitive film pattern on the conductive polysilicon film;

depositing an oxide film over the photosensitive film pattern; and applying anisotropic etch to the oxide film.

3. A method for fabricating a capacitor according to claim 1, wherein said insulating film is multilayer structure consisting of at least one film.

4. A method for fabricating a capacitor according to claim 3, wherein said insulating film of said multilayer structure comprises an oxide film and a silicon nitride film, said silicon nitride film overlaying said oxide film and serving as an etch barrier for said oxide film.

5. A method for fabricating a capacitor according to claim 1, wherein said step of etching the conductive polysilicon film to form a charge storage electrode further comprises the step of etching said insulating film formed under said conductive polysilicon film, so as to enlarge the surface area of said charge storage electrode.

6. A method for fabricating a capacitor according to claim 1, wherein said dielectric film is composite film selected from the group consisting of a nitride-oxide film and an oxide-nitride-oxide.

7. A method for fabricating a capacitor according to claim 1, wherein said step of forming a plurality of first and second spacer oxide films further comprises:

developing a photosensitive film pattern on the conductive polysilicon film and said plurality of first spacer oxide films;

depositing an oxide film over the photosensitive film pattern; and applying anisotropic etch to the oxide film.

8. A method for fabricating a capacitor in a semiconductor device, comprising the steps of:

coating an insulating film over a transistor and applying planarization to the insulating film;

etching the insulating film to form a contact hole exposing an active region of the transistor therethrough, and forming a conductive polysilicon film over the insulating film, so as to bring the conductive polysilicon film into contact with the active region;

forming a plurality of first spacer oxide films and thereafter forming a plurality of second spacer oxide films on the conductive polysilicon film;

etching the conductive polysilicon film by use of the plurality of first and second spacer oxide films as an etch mask to form a charge storage electrode comprising a plurality of vertical storage electrode portions having uniform vertical height dimensions; and coating the surface of the charge storage electrode with a dielectric film, and forming a plate electrode on the dielectric film.

9. A method for fabricating a capacitor according to claim 8, wherein said step of forming the plurality of first and second spacer oxide films further comprises:

developing a photosensitive film pattern on the conductive polysilicon film associated with each of said plurality of first and second spacer oxide films;

depositing an oxide film associated with each of said plurality of first and second spacer oxide films; and etching the oxide film associated with each of said plurality of first and second spacer oxide films.

* * * * *